(12) United States Patent
Hays et al.

(10) Patent No.: US 9,662,880 B2
(45) Date of Patent: May 30, 2017

(54) INTEGRATED THIN FILM PIEZOELECTRIC PRINTHEAD

(71) Applicant: XEROX CORPORATION, Norwalk, CT (US)

(72) Inventors: Andrew W. Hays, Fairport, NY (US); Peter J. Nystrom, Webster, NY (US); Angus I. Kingon, Warren, RI (US); Seunghyun Kim, Bristol, RI (US)

(73) Assignees: XEROX CORPORATION, Norwalk, CT (US); BROWN UNIVERSITY, Providence, RI (US)

( * ) Notice: Subject to any disclaimer, the term of this patent is extended or adjusted under 35 U.S.C. 154(b) by 0 days.

(21) Appl. No.: 14/851,422

(22) Filed: Sep. 11, 2015

(65) Prior Publication Data
US 2017/0072691 A1 Mar. 16, 2017

(51) Int. Cl.
*B41J 2/14* (2006.01)
*B41J 2/16* (2006.01)

(52) U.S. Cl.
CPC .......... *B41J 2/14233* (2013.01); *B41J 2/161* (2013.01); *B41J 2/1626* (2013.01); *B41J 2/1645* (2013.01)

(58) Field of Classification Search
None
See application file for complete search history.

(56) References Cited

U.S. PATENT DOCUMENTS

| 2001/0015739 A1* | 8/2001 | Usui | B41J 2/14233 347/68 |
|---|---|---|---|
| 2005/0012785 A1* | 1/2005 | Furuhata | B41J 2/14233 347/68 |

* cited by examiner

*Primary Examiner* — Justin Seo
(74) *Attorney, Agent, or Firm* — MH2 Technology Law Group LLP

(57) ABSTRACT

A method and structure for a piezoelectric ink jet printhead. The method can include forming a piezoelectric composite from a liquid sol-gel solution. A first layer of the liquid sol-gel solution can be deposited onto a substrate using, for example, a spin coat process, wherein the substrate may be a printhead diaphragm. The first layer may be partially cured, then a second layer of the liquid sol-gel solution can be deposited onto the partially cured first layer, which is then partially cured. Any number of layers of liquid sol-gel solution can be deposited to result in a piezoelectric composite having a suitable thickness. Subsequently, all of the partially cured layers are fully cured. Printhead processing can continue to form a completed piezoelectric ink jet printhead.

21 Claims, 4 Drawing Sheets

INTEGRATED THIN FILM PIEZOELECTRIC PRINTHEAD

TECHNICAL FIELD

The present teachings relate to the field of ink jet printing devices and, more particularly, to methods and structures for high density piezoelectric ink jet print heads and a printer including a high density piezoelectric ink jet print head.

BACKGROUND

Drop on demand ink jet technology is widely used in the printing industry. Printers using drop on demand ink jet technology may use a plurality (i.e., an array) of electrostatic actuators, piezoelectric actuators, or thermal actuators to eject ink from a plurality of nozzles in an aperture plate (nozzle plate). Even though they are more expensive to manufacture than thermal ink jets, piezoelectric ink jets are generally favored, for example because they can use a wider variety of inks.

Piezoelectric ink jet print heads include an array of actuators (i.e., piezoelectric elements or transducers). One process to form the array can include detachably bonding a blanket or bulk piezoelectric layer including a lead zirconate titanate composition to a transfer carrier with an adhesive, and dicing the blanket piezoelectric layer to form a plurality of individual piezoelectric elements. A plurality of dicing saw passes can be used to remove all the piezoelectric material between adjacent piezoelectric elements to provide the correct spacing between each piezoelectric element.

Piezoelectric ink jet print heads can typically further include a flexible diaphragm to which the array of piezoelectric elements is bonded, for example with an epoxy adhesive. The diaphragm may be a metal layer that functions as a lower electrode that is common to a plurality of actuators, or a non-metal layer coated with a metal layer that provides an individual, electrically conductive lower electrode for each actuator. When a voltage is applied across one of the actuators, the actuator bends or deflects, causing the diaphragm to flex which expels a quantity of ink from a chamber through a nozzle. The flexing further draws ink into the chamber from a main ink reservoir through an opening to replace the expelled ink.

The bulk piezoelectric composition can have a thickness of from about 2 mils to 4 mils (50 micrometers, μm, to 100 μm), and a stainless steel diaphragm having a thickness that is from about 20 μm to 50 μm thick. The bulk piezoelectric layer can be diced into square or parallelogram shapes to conform to square or parallelogram body chambers. During printing, ink is ejected from the body chambers through the nozzles in the aperture plate.

Increasing the printing resolution of an ink jet printer employing piezoelectric ink jet technology is a goal of design engineers. One way to increase the jet density is to increase the density of the actuators. In one implementation, a thin film actuator array may be bonded to relatively long and narrow body chambers to insure robustness of the diaphragm and to control vibrational modes of the diaphragm.

Forming relatively small, thin actuators and subsequently attaching them to a diaphragm becomes more difficult with decreasing actuator sizes and thicknesses. While microelectronic fabrication of printhead structures would provide precise control of resulting structures, such methods are volume sensitive and capital intensive which may preclude their use for low volume or custom products.

A method for precise formation of thin film actuators, and the resulting printhead and printer structures, would be desirable.

SUMMARY

The following presents a simplified summary in order to provide a basic understanding of some aspects of one or more embodiments of the present teachings. This summary is not an extensive overview, nor is it intended to identify key or critical elements of the present teachings, nor to delineate the scope of the disclosure. Rather, its primary purpose is merely to present one or more concepts in simplified form as a prelude to the detailed description presented later.

An embodiment of a method for forming an ink jet printhead can include depositing a liquid sol-gel solution including a piezoelectric material over a substrate, curing the liquid sol-gel solution on the substrate to form a cured piezoelectric composite, and forming an actuator array for the ink jet printhead from the piezoelectric composite, wherein the actuator array includes a plurality of individually addressable actuators.

Another embodiment of a method for forming an ink jet printhead can include depositing a first layer of liquid sol-gel solution including a piezoelectric material onto a surface of a printhead diaphragm, spin coating the first layer of liquid sol-gel solution such that the liquid sol-gel solution has a uniform thickness across the surface of the printhead diaphragm, partially curing the first layer of the liquid sol-gel solution, depositing a second layer of the liquid sol-gel solution onto the first layer of the liquid sol-gel solution after the partially curing of the first layer of the liquid sol-gel solution, and partially curing the second layer of the liquid sol-gel solution. After depositing and partially curing the second layer of the liquid sol-gel solution, the first and second layers of the sol-gel solution may be fully cured wherein, after fully curing the first and second layers of the sol-gel solution, the first and second layers of the sol-gel solution form at least part of a cured piezoelectric composite. The method can further include forming an actuator array for the ink jet printhead from the piezoelectric composite, wherein the actuator array includes a plurality of individually addressable actuators.

In another embodiment, a piezoelectric ink jet printhead can include a diaphragm and an actuator array overlying the diaphragm, wherein the actuator array includes a plurality of individual actuators and each individual actuator includes a first layer of piezoelectric material and at least a second layer of piezoelectric material, wherein the first layer of piezoelectric material physically contacts the second layer of piezoelectric material. The piezoelectric ink jet printhead can further include a top electrode array overlying the actuator array, wherein the top electrode array includes a plurality of top electrodes.

BRIEF DESCRIPTION OF THE DRAWINGS

The accompanying drawings, which are incorporated in, and constitute a part of this specification, illustrate embodiments of the present teachings and, together with the description, serve to explain the principles of the disclosure. In the figures.

It should be noted that some details of the FIGS. have been simplified and are drawn to facilitate understanding of the present teachings rather than to maintain strict structural accuracy, detail, and scale.

DETAILED DESCRIPTION

Reference will now be made in detail to exemplary embodiments of the present teachings, examples of which are illustrated in the accompanying drawings. Wherever possible, the same reference numbers will be used throughout the drawings to refer to the same or like parts.

As used herein, unless otherwise specified, the word "printer" encompasses any apparatus that performs a print outputting function for any purpose, such as a digital copier, bookmaking machine, facsimile machine, a multi-function machine, electrostatographic device, etc.

Forming relatively small, thin actuators and subsequently attaching them to a diaphragm becomes more difficult with decreasing actuator sizes and thicknesses. An embodiment of the present teachings can provide a structure and a method for forming an actuator array driver system directly on a substrate, a diaphragm, or another printhead structure.

Figure 1:
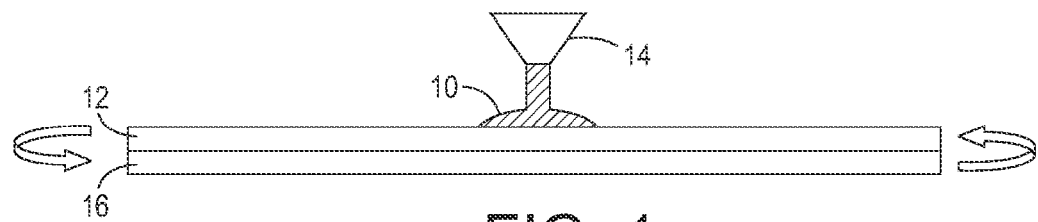
FIGS. 1-7 are cross sections depicting an embodiment of the present teachings to form a piezoelectric ink jet printhead.

FIGS. 1-6 are cross sections depicting various in-process structures that can be formed during an embodiment of the present teachings. It will be understood that the FIGS. are generalized schematic depictions and that a structure in accordance with an embodiment may include other substructures that are not depicted for simplicity, while various depicted substructures may be removed or modified. FIG. 1 illustrates the deposition of a liquid actuator material 10 onto a substrate 12 from a dispenser 14. The dispenser 14 may be a spin coat apparatus that includes, for example, a chuck or platform 16 that positions the substrate 12 and rotates the substrate 12. Other dispensers are also contemplated including, but not limited to, a spray coating apparatus and a dip coating apparatus.

The substrate 12 may be a printhead diaphragm that will be subsequently attached to a printhead jet stack as described below. The diaphragm may be removably attached to a supporting substrate during formation of the piezoelectric layer. In another embodiment, during formation of the piezoelectric electric layer, the diaphragm may already be attached to a portion of the printhead jet stack such that the substrate 12 includes the printhead diaphragm and jet stack, and FIG. 1 depicts depositing the actuator material 10 onto a printhead diaphragm that is attached to a printhead jet stack. In another embodiment as described below, the substrate 12 may be a transfer layer that is not present in the final printhead structure.

In an embodiment, the actuator material 10 may be a liquid, chemically stable sol-gel solution or composite that includes a piezoelectric material in an appropriate solution. For example, the sol-gel solution can include from about 0.3 moles per liter (mol/L) to about 0.7 mol/L of the piezoelectric material, wherein the piezoelectric material includes a Bi—Na—K—Ti—O oxide (i.e., an oxide that may be of the composition $Bi_vNa_wK_xTi_yO_z$, where the values of v-z are as described below, or another form). In solution, the prescribed elements are present as solubilized molecular precursors. In addition to Bi—Na—K—Ti—O oxide, the piezoelectric material may further include a Bi—Mg—Ti—O oxide (i.e., an oxide that may be in the form in the form $Bi_aMg_bTi_cO_d$, where the values of a-d are as described below, or another form). Measured as a weight percent (wt %), the sol-gel solution can include the piezoelectric material, either Bi—Na—K—Ti—O or a mixture of Bi—Na—K—Ti—O and Bi—Mg—Ti—O (i.e., Bi—Na—K—Ti—O+Bi—Mg—Ti—O) in a range of from about 15 wt % to about 40 wt % of the piezoelectric sol-gel solution.

The molecular precursors of the piezoelectric material solute are mixed with a sufficient amount of solvent and, optionally, any additional materials as described herein, such that the piezoelectric material has a concentration of from about 0.3 mol/L to about 0.7 mol/L. The solvent may include one or more of butanol (i.e., butyl alcohol, $C_4H_9OH$), ethanol (i.e., ethyl alcohol, $C_2H_5OH$), methanol (i.e., methyl alcohol, $CH_3OH$), isopropanol (i.e., isopropyl alcohol, $C_3H_7OH$) and 2-methoxyethanol (i.e., methyl cellulose, $C_3H_8O_2$). Other alcoholic solvents are contemplated. The sol-gel solution may have a viscosity in the range of from about 4.0 centipoise (cP) to about 8.0 cP.

The sol-gel solution may be prepared using various techniques. In one exemplary technique, Bi, Na, K, and Ti precursors may be mixed within the solvent and then reacted together to form the sol-gel. The oxygen component to form the $Bi_vNa_wK_xTi_yO_z$ oxide piezoelectric material is provided by the molecular precursors. If the sol-gel is to also include $Bi_aMg_bTi_cO_d$, then Bi, Mg, and Ti precursors may be subsequently mixed in the Bi—N—K—Ti—O solution, forming a $Bi_vNa_wK_xTi_yO_z$—$Bi_aMg_bTi_cO_d$ solid solution during the subsequent annealing process described below. The oxygen component to form the $Bi_aMg_bTi_cO_d$ oxide piezoelectric material is provided by the molecular precursors.

In another embodiment, two separate solutions can be prepared. For a first solution, Bi, Na, K, and Ti precursors may be mixed within a solvent and then reacted together to form a first sol-gel component. For a second solution, Bi, Mg, and Ti precursors may be mixed within a solvent and the reacted together to form a second sol-gel component. Subsequently, the first sol-gel component and the second sol-gel component are mixed together to form the sol-gel.

Figure 2:
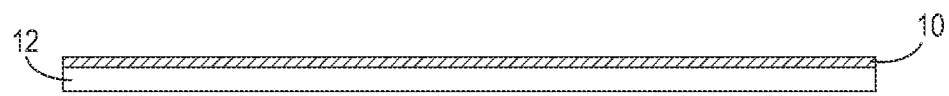

The sol-gel solution may be dispensed at a temperature of from about room temperature (i.e., about 20° C.) to about 100° C. During deposition of the sol-gel solution 10 onto the substrate 12, the substrate 12 can be rotated by the spin coat apparatus 14 to form a thin sol-gel layer 10 having a relatively uniform thickness as depicted in FIG. 2. During formation of the sol-gel layer, the substrate 12 may be rotated at a speed of from about 2500 rotations per minute (rpm) to about 3500 rpm, or from about 2750 rpm to about 3250 rpm, or about 3000 rpm. Rotation can be performed for a duration sufficient to thin the sol-gel layer 10 to a thickness of between about 50 nanometers (nm) for each coating layer and about 200 nm for each coating layer. Multiple coating layers may be applied as described below to form a final structure having a desired thickness.

Subsequently, the sol-gel layer 10 is subjected to a first curing process to partially or completely dry the sol-gel layer to remove at least part of the solvent component. The first curing process, and subsequent curing processes as described below, may include a drying process that heats the sol-gel layer using one or more of a sintering process, a pyrolizing process, a calcination process, and/or an annealing process. The molecular precursors react during this high temperature processing to result in the final oxide piezoelectric of the desired composition.

In an embodiment, the sol-gel layer 10 of FIG. 2 can be heated to a first temperature of from about 400° C. to about 500° C., or from about 425° C. to about 475° C., or to about 450° C. The first temperature can be maintained for from about 4 minutes to about 10 minutes, or from about 6 minutes to about 8 minutes, for example about 7 minutes. Subsequently, the sol-gel layer 10 can be heated to a second temperature of from about 600° C. to about 700° C., or from about 625° C. to about 675° C., or to about 650° C. The second temperature can be maintained for between about 1 minute and about 5 minutes, or from about 2 minutes to about 4 minutes, for example about 3 minutes.

Figure 3:
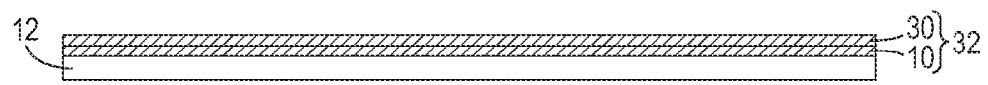

Next, the deposition and first curing processes described above can be repeated for a number of iterations sufficient to form a final actuator layer having a desired thickness to result in the structure of FIG. 3. While FIG. 3 depicts two sol-gel layers 10, 30 that together form an actuator layer laminate or composite 32 (hereinafter, a piezoelectric composite 32), it will be understood that any number of actuator layers can be formed during fabrication of the piezoelectric composite 32. For example, from about 5 layers to about 500 layers, or from about 5 layers to about 300 layers, or from about 5 layers to about 200 layers, or from about 10 layers to about 250 layers, or from about 10 layers to about 100 layers, or from about 15 layers to about 75 layers, or more than 10 layers, or more than 100 layers, or more that 250 layers, or more than 500 layers may be formed to make up the piezoelectric composite 32. In this embodiment, each sol-gel layer is formed directly on the previous partially or completely cured sol-gel layer with no intervening layers therebetween, such that the piezoelectric composite includes at least two layers of piezoelectric material that physically contact each other. While the process and structure are described below with reference to a plurality of actuator layers, it will be understood that in another embodiment a single actuator layer 10 may be of a sufficient thickness that additional piezoelectric layers are not needed, in which case the piezoelectric composite refers to a single piezoelectric layer.

After the final piezoelectric layer is formed, the FIG. 3 structure is subjected to a second or final curing process to remove most or all of the solvent component of the sol-gel layers that form the piezoelectric composite 32. The final curing process can including heating the FIG. 3 structure to a temperature of from about 600° C. to about 700° C., or from about 625° C. to about 675° C., or to about 650° C. This temperature can be maintained for a duration of between about 20 minutes and about 40 minutes, or from about 25 minutes to about 35 minutes, for example about 30 minutes. After this final curing process, the resulting piezoelectric composite 32 can have a desired thickness, for example from 500 nanometers (nm) to about 20,000 nm (2.0 µm), or from about 500 nm to about 900 nm, or from about 600 nm to about 800 nm, or about 700 nm. The chemical composition of the fully cured piezoelectric composite may include Bi—Na—K—Ti—O, in the form $Bi_vNa_wK_xTi_yO_z$, where "v" ranges from 0 to 0.5 (i.e., 0~0.5, where the range of the Bi component is from 0 to 0.5 mol), "w" is in the range of about 0.5~1, "x" is in the range of about 0~0.5, "y" is in the range of about 0.5~1 and "z" is in the range of about 1.5~3.5. In various embodiments, the Bi—Na—K—Ti—O may be modified with (i.e., mixed in solution with) Bi—Mg—Ti—O in the form $Bi_aMg_bTi_cO_d$, where "a" is in the range of from about 0.5~1, "b" is in the range of from about 0~0.5, "c" is in the range of from about 0~0.5, and "d" is in the range of from about 1.5~3.5.

An embodiment can include $1-y[Bi_{0.5}(Na_x, K_{1-x})TiO_3]+yBi(Mg_{0.5},Ti_{0.5})O_3$. In an embodiment, "x" may be in the range of from about 0.5~0.8 and "y" may range from about 0~0.1. In an embodiment, x=0.78 and y ranges from about 0~0.04. In an embodiment, x=0.78 and y=0.035, and the piezoelectric material oxides may be in the form $0.965Bi_{0.5}(Na_{0.78}K_{0.22})_{0.5}TiO_3+0.035Bi(Mg_{0.5}Ti_{0.5}O_3$ solid solution.

After forming the piezoelectric composite 32 as depicted in FIG. 3, printhead processing may continue to form a completed printhead. In one embodiment, an electrically conductive top electrode layer 40 can be formed on the exposed surface of the piezoelectric composite 32. In this embodiment, the top electrode layer 40 may be formed as a blanket layer as depicted. The top electrode layer 40 can be, for example, a metal such as copper, gold, titanium, nickel, or a metal alloy, or an electrically conductive non-metal, and may be formed to a thickness of from about 100 nm (0.1 µm) to about 1100 nm (1.1 µm). The top electrode layer 40 may be formed using sputtering, chemical vapor deposition, electroplating, or another suitable process.

Figure 4:
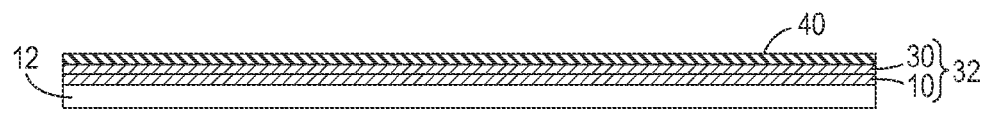
Figure 5:
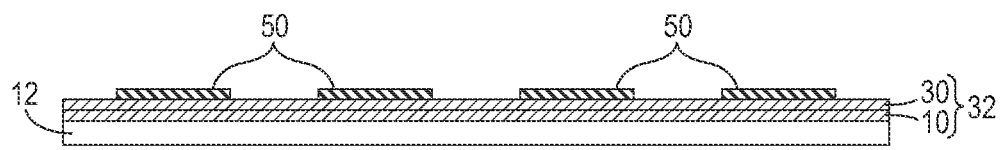

Next, the top electrode layer 40 is patterned to result in the array of individual top electrodes (i.e., top plates) 50 as depicted in FIG. 5. Patterning can be performed, for example, using a lithographic process that masks and chemically and/or mechanically etches a portion of the top electrode layer 40 to result in the top electrode array 50. In another embodiment, a laser ablation process may be used. In other embodiments, the plurality of top electrodes 50 can be directly formed, written, or printed onto the top of the FIG. 3 structure such that the individual patterning of blanket layer 40 of FIG. 4 is not necessary and processing bypasses the FIG. 4 structure and proceeds directly from FIG. 3 to FIG. 5.

Figure 6:
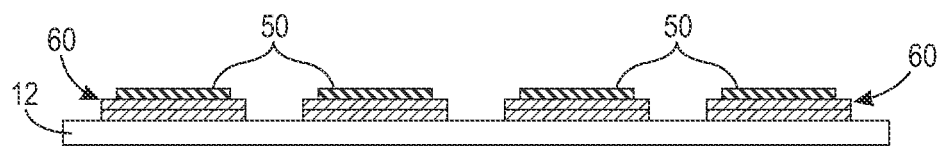

Next, the piezoelectric composite 32 is patterned as depicted in FIG. 6 to provide an array of individual actuators 60. The piezoelectric composite 32 can be patterned using, for example, lithography and chemical and/or mechanical etching, a dicing process using, for example, a dicing saw such as a wafer saw, or another process. In an embodiment, the substrate 12 may be used as an etch stop layer.

Figure 7:
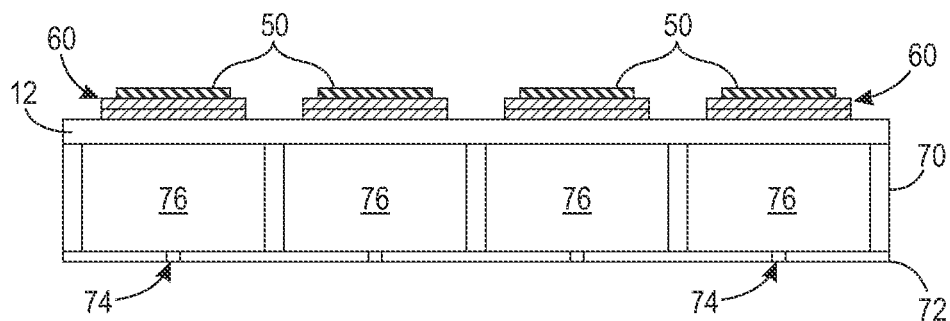

Subsequently, the substrate 12, in this embodiment the printhead diaphragm 12, is removed from the platform 16 (FIG. 1) if it has not already removed during prior processing. The printhead diaphragm 12, array of actuators 60, and array of top plates 50 are then bonded to a printhead jet stack using a suitable adhesive or other bonding technique, such as brazing, soldering, clamping, etc. The printhead jet stack may include a plurality of walls 70 and an aperture plate 72 having a plurality of nozzles 74 as depicted in FIG. 7. The walls 70, aperture plate 72, and diaphragm 12 may provide a plurality of ink chambers 76.

In this embodiment, a plurality of ink ejectors are formed in part by a nozzle 74, an ink chamber 76, the diaphragm 12, an actuator 60, and a top electrode 50. Each top electrode is individually addressable through drive electronics (not individually depicted for simplicity) in electrical communication with the top electrode 50, the diaphragm 12, and the actuator 60. The electrically conductive diaphragm 12 functions as a bottom electrode (i.e., bottom plate) that is common to a plurality of ejectors. During printing, ink 106 (FIG. 10) is ejected from the ink chambers 76 through the nozzles 74 in response to the application of a voltage between the top electrode 50 and the diaphragm 60. In response to the voltage, the associated actuator 60 bends or deflects, which deflects the diaphragm 60 over the associated ink chamber 76, and creates a pressure pulse in the ink chamber 76 to eject ink from the associated nozzle 74.

Figure 8:
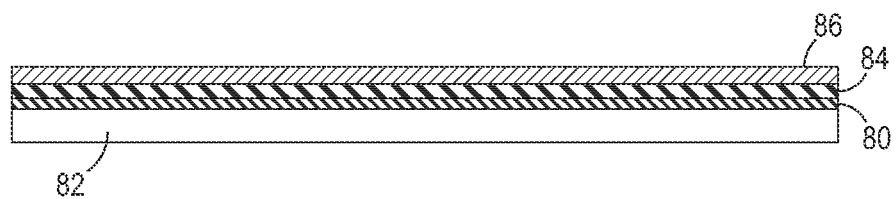
FIGS. 8 and 9 are cross sections depicting another embodiment of the present teachings to form a piezoelectric ink jet printhead.

Various modifications to the structure and process described above will be evident from the disclosure herein. For example, as depicted in FIG. 8, a release layer 80 may be formed over a substrate 82, and a top electrode layer 84 may be formed on the release layer 80. Subsequently, a piezoelectric composite 86, including one or more individual piezoelectric layers, may be formed on the top electrode layer 84, for example, using a process as described above.

Figure 9:
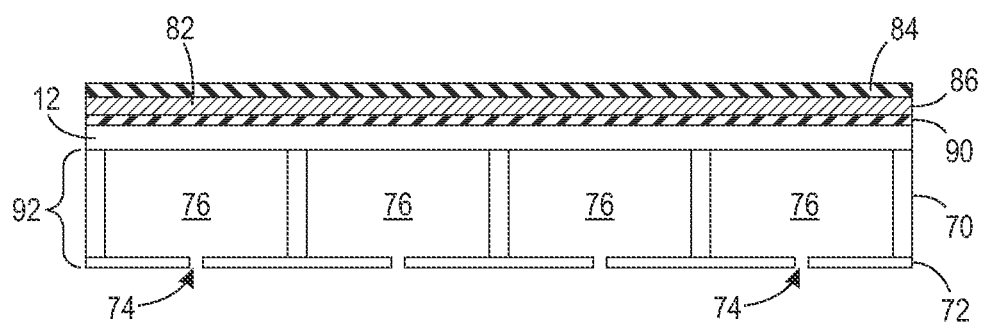

Subsequently, the top electrode layer 84 and the piezoelectric composite 86 may be released from the substrate 82, for example, by dissolving a dissolvable release layer 80 in a solvent, or by heating and flowing the release layer 80 if the release layer 80 is a thermoplastic. The piezoelectric composite 86 may then be bonded to a diaphragm 12 using, for example, an adhesive 90 or other bonding technique. In an embodiment, the diaphragm 12 may be part of a completed jet stack 92 during attachment of the top electrode layer 84 and the piezoelectric composite 86. In another embodiment, the diaphragm 12, top electrode layer 84, and piezoelectric composite 86 may be subsequently attached to the jet stack 92. In either case, processing can continue to form individual top electrodes 50 and actuators 60, for example depicted in FIG. 9, and other drive electronics.

In an embodiment, the exposed surface of the diaphragm 12 of FIG. 1 can be treated or cleaned to enhance the contact bond between the diaphragm 12 and the cured piezoelectric sol-gel solution 10. In an embodiment, the exposed surface of the diaphragm 12 can be chemically treated using, for example, one or more solvents, detergents, or a mild etchant. In another embodiment, the exposed surface of the diaphragm 12 can be treated through exposure to a plasma such as an oxygen plasma and/or reducing gases including hydrogen. In another embodiment, the exposed surface of the diaphragm 12 can be treated using an ultrasonic cleaning process, or treated using a polishing process such as a chemical, a mechanical, or a chemical-mechanical polishing process. In another embodiment, an optional adhesion layer, a buffer layer, or a surface energy modification layer can be formed over the exposed surface of the diaphragm 12 prior to applying or dispensing the sol-gel layer 10 to the diaphragm 12. One or more of these treatments, which may be represented by layer 80 in FIG. 8, for example, can be performed either before or after attachment to the chuck 16 of the spin coating apparatus 14.

It will be appreciated that other processing stages may be performed instead of, or in addition to, the embodiments listed above. For example, various printhead structures may be positioned in a stack press to enhance or facilitate physical and/or electrical attachment of various printhead layers. The completed printhead may include other ink chambers, ink paths, ink reservoirs, electrical structures that serve as drive electronics, or other electrical or mechanical structures related to the functionality, appearance, or attachment of the printhead.

Figure 10:
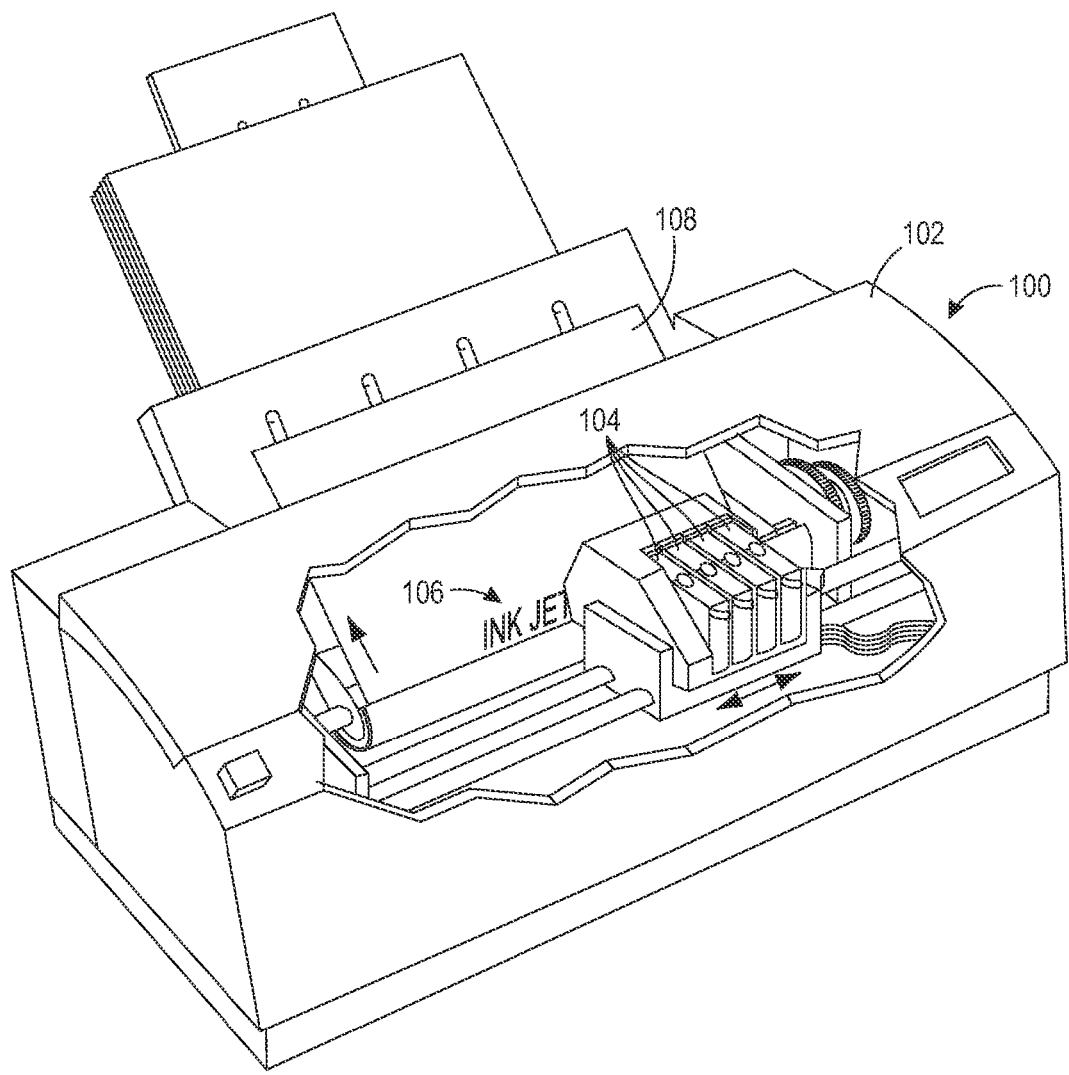
FIG. 10 is a perspective depiction of a printer including a printhead according to an embodiment of the present teachings.

FIG. 10 depicts a printer 100 including a printer housing 102 into which at least one printhead 104 including an embodiment of the present teachings has been installed. The housing 102 may encase the printhead 104. During operation, ink 106 is ejected from one or more printheads 104. The printhead 104 is operated in accordance with digital instructions to create a desired image on a print medium 108 such as a paper sheet, plastic, etc. The printhead 104 may move back and forth relative to the print medium 108 in a scanning motion to generate the printed image swath by swath. Alternately, the printhead 104 may be held fixed and the print medium 108 moved relative to it, creating an image as wide as the printhead 104 in a single pass. The printhead 104 can be narrower than, or as wide as, the print medium 108. In another embodiment, the printhead 104 can print to an intermediate surface such as a rotating drum or belt (not depicted for simplicity) for subsequent transfer to a print medium.

Notwithstanding that the numerical ranges and parameters setting forth the broad scope of the present teachings are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume negative values, e.g. −1, −2, −3, −10, −20, −30, etc.

While the present teachings have been illustrated with respect to one or more implementations, alterations and/or modifications can be made to the illustrated examples without departing from the spirit and scope of the appended claims. For example, it will be appreciated that while the process is described as a series of acts or events, the present teachings are not limited by the ordering of such acts or events. Some acts may occur in different orders and/or concurrently with other acts or events apart from those described herein. Also, not all process stages may be required to implement a methodology in accordance with one or more aspects or embodiments of the present teachings. It will be appreciated that structural components and/or processing stages can be added or existing structural components and/or processing stages can be removed or modified. Further, one or more of the acts depicted herein may be carried out in one or more separate acts and/or phases. Furthermore, to the extent that the terms "including," "includes," "having," "has," "with," or variants thereof are used in either the detailed description and the claims, such terms are intended to be inclusive in a manner similar to the term "comprising." The term "at least one of" is used to mean one or more of the listed items can be selected. As used herein, the term "one or more of" with respect to a listing of items such as, for example, A and B, means A alone, B alone, or A and B. The term "at least one of" is used to mean one or more of the listed items can be selected. Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "conformal" describes a coating material in which angles of the underlying material are preserved by the conformal material. The term "about" indicates that the value listed may be somewhat altered, as long as the alteration does not result in nonconformance of the process or structure to the illustrated embodiment. Finally, "exemplary" indicates the description is used as an example, rather than implying that it is an ideal. Other embodiments of the present teachings will be apparent to those skilled in the art from consideration of the specification and practice of the disclosure herein. It is intended that the specification and examples be considered as exemplary only, with a true scope and spirit of the present teachings being indicated by the following claims.

Terms of relative position as used in this application are defined based on a plane parallel to the conventional plane or working surface of a workpiece, regardless of the orientation of the workpiece. The term "horizontal" or "lateral" as used in this application is defined as a plane parallel to the conventional plane or working surface of a workpiece, regardless of the orientation of the workpiece. The term "vertical" refers to a direction perpendicular to the horizontal. Terms such as "on," "side" (as in "sidewall"), "higher," "lower," "over," "top," and "under" are defined with respect to the conventional plane or working surface being on the top surface of the workpiece, regardless of the orientation of the workpiece.

The invention claimed is:

1. A method for forming an ink jet printhead, comprising:
   depositing a liquid sol-gel solution comprising a piezoelectric material including a Bi—Na—K—Ti—O oxide and at least one of butanol, ethanol, methanol, isopropanol, and 2-methoxyethanol over a substrate;
   curing the liquid sol-gel solution on the substrate to form a cured piezoelectric composite; and
   forming an actuator array for the ink jet printhead from the piezoelectric composite, wherein the actuator array comprises a plurality of individually addressable actuators.

2. The method of claim 1, further comprising spin coating the liquid sol-gel solution onto the substrate, wherein the curing of the liquid sol-gel solution on the substrate is performed after the spin coating.

3. The method of claim 1, further comprising etching the cured piezoelectric composite to form the actuator array.

4. The method of claim 1, wherein the substrate is a printhead diaphragm and the method further comprises attaching the printhead diaphragm to a printhead jet stack.

5. The method of claim 4, further comprising:
   etching the cured actuator composite to form the actuator array; and
   performing the attachment of the printhead diaphragm to the jet stack subsequent to the etching of the cured actuator composite.

6. The method of claim 1, further comprising:
   forming an electrically conductive top electrode layer over the substrate; then
   depositing the liquid sol-gel solution over the substrate and onto the top electrode layer;
   attaching the cured piezoelectric composite and the top electrode layer to a printhead diaphragm; and
   removing the cured piezoelectric composite and the top electrode layer from the substrate.

7. The method of claim 6, further comprising:
   forming a release layer on the substrate prior to forming the top electrode layer;
   forming the electrically conductive top electrode layer on the release layer and over the substrate; and
   removing the release layer to release the electrically conductive top electrode layer from the substrate.

8. The method of claim 7, further comprising removing the release layer using a method selected from the group consisting of flowing the release layer through the application of heat to the release layer and dissolving the release layer using a solvent.

9. A method for forming an ink jet printhead, comprising:
   depositing a first layer of liquid sol-gel solution comprising a piezoelectric material including a Bi—Na—K—Ti—O oxide and at least one of butanol, ethanol, methanol, isopropanol, and 2-methoxyethanol onto a surface of a printhead diaphragm;
   spin coating the first layer of liquid sol-gel solution such that the liquid sol-gel solution has a uniform thickness across the surface of the printhead diaphragm;
   partially curing the first layer of the liquid sol-gel solution;
   depositing a second layer of the liquid sol-gel solution onto the first layer of the liquid sol-gel solution after the partially curing of the first layer of the liquid sol-gel solution;
   partially curing the second layer of the liquid sol-gel solution;
   after depositing and partially curing the second layer of the liquid sol-gel solution, fully curing the first and second layers of the sol-gel solution wherein, after fully curing the first and second layers of the sol-gel solution, the first and second layers of the sol-gel solution form at least part of a cured piezoelectric composite; and
   forming an actuator array for the ink jet printhead from the piezoelectric composite, wherein the actuator array comprises a plurality of individually addressable actuators.

10. The method of claim 9, further comprising:
    heating the first layer of the liquid sol-gel solution to a first temperature of from 400° C. to 500° C. during the partially curing of the first layer of the liquid sol-gel solution;
    maintaining the first layer of the liquid sol-gel solution at the first temperature for from 4 minutes to 10 minutes;
    heating the first layer of the liquid sol-gel solution to a second temperature of from 600° C. to 700° C. during the partially curing of the first layer of the liquid sol-gel solution;
    maintaining the first layer of the liquid sol-gel solution at the second temperature for from 1 minutes to 5 minutes;
    heating the first layer of the liquid sol-gel solution to the first temperature of from 400° C. to 500° C. during the partially curing of the second layer of the liquid sol-gel solution;
    maintaining the second layer of the liquid sol-gel solution at the first temperature for from 4 minutes to 10 minutes;
    heating the second layer of the liquid sol-gel solution to a second temperature of from 600° C. to 700° C. during the partially curing of the second layer of the liquid sol-gel solution;
    maintaining the second layer of the liquid sol-gel solution at the second temperature for from 1 minutes to 5 minutes; then
    heating the first and second layers of the partially cured sol-gel solution to a final curing temperature of from 600° C. to 700° C. during the fully curing of the first and second layers of the sol-gel solution; and
    maintaining the first and second layers of the sol-gel solution at the final curing temperature for from 20 minutes to 40 minutes.

11. The method of claim 9, further comprising attaching the printhead diaphragm to a printhead jet stack.

12. The method of claim 11, further comprising:
    etching the cured actuator composite to form the actuator array; and performing the attachment of the printhead diaphragm to the jet stack subsequent to the etching of the cured actuator composite.

13. The method of claim 9, further comprising:
forming an electrically conductive top electrode layer over the piezoelectric composite; then etching the top electrode layer to form a top electrode array comprising a plurality of top electrodes.

14. A piezoelectric ink jet printhead, comprising:
a diaphragm;
an actuator array overlying the diaphragm, wherein:
the actuator array comprises a plurality of individual actuators;
each individual actuator comprises a first layer of piezoelectric material and at least a second layer of piezoelectric material;
the first layer of piezoelectric material physically contacts the second layer of piezoelectric material; and
the first layer of piezoelectric material and the second layer of piezoelectric material each comprise $Bi_{0\sim0.5}$, $Na_{0.5\sim1}$, $K_{0\sim0.5}$, and $Ti_{0.5\sim1}$; and
a top electrode array overlying the actuator array, wherein the top electrode array comprises a plurality of top electrodes.

15. The piezoelectric ink jet printhead of claim 14, wherein the first layer of piezoelectric material and the second layer of piezoelectric material each further comprise $Bi_{0.5\sim1}$, $Mg_{0\sim0.5}$, and $Ti_{0\sim0.5}$.

16. The piezoelectric ink jet printhead of claim 14, wherein the first layer of piezoelectric material and the second layer of piezoelectric material each comprise $1-y[Bi_{0.5}Na_xK_{1-x})TiO_3]+yBi(Mg_{0.5}Ti_{0.5})O_3$.

17. The piezoelectric ink jet printhead of claim 16, where x ranges from 0.5 to 0.8 and y ranges from 0 to 0.1.

18. The piezoelectric ink jet printhead of claim 14, wherein the first layer of piezoelectric material and the second layer of piezoelectric material each comprise $1-y[Bi_{0.5}(Na_xK_{1-x})TiO_3]+yBi(Mg_{0.5}Ti_{0.5})O_3$, where x is 0.78 and y ranges from 0 to 0.04.

19. The piezoelectric ink jet printhead of claim 14, wherein the first layer of piezoelectric material and the second layer of piezoelectric material each comprise $1-y[Bi_{0.5}(Na_xK_{1-x})TiO_3]+yBi(Mg_{0.5}Ti_{0.5})O_3$, where x is 0.78 and y is 0.035.

20. A method for forming an ink jet printhead, comprising:
depositing a layer of liquid sol-gel solution comprising a piezoelectric material onto a surface of a printhead diaphragm;
spin coating the layer of liquid sol-gel solution such that the liquid sol-gel solution has a uniform thickness across the surface of the printhead diaphragm;
partially curing the layer of the liquid sol-gel solution using a process comprising:
heating the layer of the liquid sol-gel solution to a first temperature of from 400° C. to 500° C.;
maintaining the layer of the liquid sol-gel solution at the first temperature for from 4 minutes to 10 minutes;
heating the layer of the liquid sol-gel solution to a second temperature of from 600° C. to 700° C.; and
maintaining the layer of the liquid sol-gel solution at the second temperature for from 1 minute to 5 minutes; then
fully curing the layer of the sol-gel solution using a process comprising:
heating the layer of the partially cured sol-gel solution to a final curing temperature of from 600° C. to 700° C.; and
maintaining the layer of the sol-gel solution at the final curing temperature for from 20 minutes to 40 minutes wherein, after fully curing the layer of the sol-gel solution, the layer of the sol-gel solution forms at least part of a cured piezoelectric composite; and
forming an actuator array for the ink jet printhead from the cured piezoelectric composite, wherein the actuator array comprises a plurality of individually addressable actuators.

21. The method of claim 20 wherein the layer of liquid sol-gel solution is a first layer of liquid sol-gel solution and the method further comprises:
depositing a second layer of the liquid sol-gel solution onto the first layer of the liquid sol-gel solution after the partially curing of the first layer of the liquid sol-gel solution;
partially curing the second layer of the liquid sol-gel solution using a process comprising:
heating the second layer of the liquid sol-gel solution to the first temperature of from 400° C. to 500° C.;
maintaining the second layer of the liquid sol-gel solution at the second temperature for from 4 minutes to 10 minutes;
heating the second layer of the liquid sol-gel solution to the second temperature of from 600° C. to 700° C.; and
maintaining the second layer of the liquid sol-gel solution at the second temperature for from 1 minute to 5 minutes; then
during the fully curing of the first layer of the sol-gel solution, fully curing both the first and second layers of the sol-gel solution wherein, after fully curing the first and second layers of the sol-gel solution, the first and second layers of the sol-gel solution form at least part of the cured piezoelectric composite.

* * * * *